(12) United States Patent
Takiba et al.

(10) Patent No.: US 7,196,311 B2
(45) Date of Patent: Mar. 27, 2007

(54) SEMICONDUCTOR PHOTOSENSOR

(75) Inventors: Yukiko Takiba, Kanagawa (JP);
Hiroshi Suzunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 11/201,254

(22) Filed: Aug. 11, 2005

(65) Prior Publication Data
US 2006/0266928 A1  Nov. 30, 2006

(30) Foreign Application Priority Data
May 25, 2005  (JP)  ............... 2005-151927

(51) Int. Cl.
  H01J 40/14  (2006.01)
  H01L 27/15  (2006.01)
(52) U.S. Cl. ............... 250/214 R; 250/214.1; 250/214 A; 257/257
(58) Field of Classification Search ............ 250/208.1, 250/214 R, 214.1, 214 A; 257/233, 257, 257/431, 458, E31.05
See application file for complete search history.

(56) References Cited

U.S. PATENT DOCUMENTS

| | | | |
|---|---|---|---|
| 6,831,344 B2 | 12/2004 | Ogawa et al. | |
| 2001/0013573 A1* | 8/2001 | Fujino | ............ 250/214 A |
| 2002/0121652 A1* | 9/2002 | Yamasaki | ............ 257/222 |
| 2003/0218175 A1* | 11/2003 | Ogawa et al. | ............ 257/80 |
| 2005/0051704 A1 | 3/2005 | Kashiura et al. | |

FOREIGN PATENT DOCUMENTS

| | | |
|---|---|---|
| JP | 8-330621 | 12/1996 |
| JP | 2004-214341 | 7/2004 |

OTHER PUBLICATIONS

U.S. Appl. No. 11/201,254, Aug. 11, 2005, Takiba et al.
U.S. Appl. No. 11/472,366, Jun. 22, 2006, Takiba et al.

* cited by examiner

*Primary Examiner*—Stephone B. Allen
(74) *Attorney, Agent, or Firm*—Oblon, Spivak, McClelland, Maier & Neustadt, P.C.

(57) ABSTRACT

A semiconductor photosensor comprises: a semiconductor substrate; a first photodiode formed on the semiconductor substrate; a second photodiode formed on the semiconductor substrate; a first amplifier circuit configured to amplify photocurrent from the first photodiode, the first amplifier circuit being formed on the semiconductor substrate; a second amplifier circuit configured to amplify photocurrent from the second photodiode, the second amplifier circuit being formed on the semiconductor substrate and having an amplifying characteristic substantially identical to that of the first photodiode; an infrared transmissive filter configured to attenuate visible light components relative to infrared light components in incident light, the infrared transmissive filter being provided on the second photodiode; and a subtraction circuit configured to output a difference between an output of the first amplifier circuit and an output of the second amplifier circuit, the subtraction circuit being formed on the semiconductor substrate.

20 Claims, 17 Drawing Sheets

_SEMICONDUCTOR PHOTOSENSOR_

SEMICONDUCTOR PHOTOSENSOR

CROSS-REFERENCE TO RELATED APPLICATIONS

This application is based upon and claims the benefit of priority from the prior Japanese Patent Application No. 2005-151927, filed on May 25, 2005; the entire contents of which are incorporated herein by reference.

BACKGROUND OF THE INVENTION

1. Field of the Invention

This invention relates to a semiconductor photosensor, and more particularly to a semiconductor photosensor having a spectral sensitivity characteristic close to human eye spectral sensitivity.

2. Background Art

Semiconductor photosensors are increasingly installed in information equipments for input and display of image information such as portable information equipments, liquid crystal TV sets, and digital cameras. For example, portable information equipments such as mobile phones, notebook personal computers, and PDAs (Personal Digital Assistants) are equipped with backlight for liquid crystal or other display screens and/or keypad illumination. In this situation, the brightness of semiconductor light emitting devices such as LEDs (Light Emitting Diodes) can be controlled in response to the ambient darkness to improve visibility and reduce power consumption. Taking a mobile phone as an example, in the daytime or in a well-lighted room, keypad LEDs are turned off and the brightness of backlight of the transmissive liquid crystal display is increased. On the other hand, in the outdoors at night, the keypad LEDs are turned on and the backlight of the liquid crystal display is reduced.

In addition, when video is displayed on a liquid crystal TV set or a mobile phone, it is desirable to use different gamma values for correction depending on the usage environment in order to improve visibility of the screen. To achieve this, semiconductor photosensors are required to have a spectral sensitivity characteristic in close agreement with human eye spectral sensitivity. Note that the semiconductor photosensors used for these applications are sometimes referred to as "illuminance sensors".

A technology intended to achieve a spectral characteristic in close agreement with human eye spectral sensitivity is disclosed in Japanese Laid-Open Patent Application H8-330621 (1996). According to this technology, two light receiving means are provided. One of them receives light via an optical filter, which has the function of transmitting infrared light (blocking visible light). Therefore, subtraction between the detection outputs of the two light receiving means can be used to obtain a spectral sensitivity characteristic in the visible light region, that is, close to human eye spectral sensitivity.

Recently, however, sophisticated brightness control such as in video display requires a spectral sensitivity characteristic in closer agreement with human eye spectral sensitivity.

SUMMARY OF THE INVENTION

According to an aspect of the invention, there is provided a semiconductor photosensor comprising:

a semiconductor substrate;

a first photodiode formed on the semiconductor substrate;

a second photodiode formed on the semiconductor substrate;

a first amplifier circuit configured to amplify photocurrent from the first photodiode, the first amplifier circuit being formed on the semiconductor substrate;

a second amplifier circuit configured to amplify photocurrent from the second photodiode, the second amplifier circuit being formed on the semiconductor substrate and having an amplifying characteristic substantially identical to that of the first photodiode;

an infrared transmissive filter configured to attenuate visible light components relative to infrared light components in incident light, the infrared transmissive filter being provided on the second photodiode; and a subtraction circuit configured to output a difference between an output of the first amplifier circuit and an output of the second amplifier circuit, the subtraction circuit being formed on the semiconductor substrate, a distance from a first side face of the semiconductor substrate to a center of the first photodiode being substantially equal to a distance from a second side face of the semiconductor substrate to a center of the second photodiode, the second side face being opposed to the first side face.

According to other aspect of the invention, there is provided a semiconductor photosensor comprising:

a semiconductor substrate;

a first photodiode formed on the semiconductor substrate;

a second photodiode formed on the semiconductor substrate;

a first amplifier circuit configured to amplify photocurrent from the first photodiode, the first amplifier circuit being formed on the semiconductor substrate;

a second amplifier circuit configured to amplify photocurrent from the second photodiode, the second amplifier circuit being formed on the semiconductor substrate and having an amplifying characteristic substantially identical to that of the first photodiode;

an infrared transmissive filter configured to attenuate visible light components relative to infrared light components in incident light, the infrared transmissive filter being provided on the second photodiode; and a subtraction circuit configured to output a difference between an output of the first amplifier circuit and an output of the second amplifier circuit, the subtraction circuit being formed on the semiconductor substrate, on the semiconductor substrate, the first photodiode and the second photodiode being placed substantially symmetric with respect to a line passing through a center of the semiconductor substrate.

According to other aspect of the invention, there is provided a semiconductor photosensor comprising:

a semiconductor substrate;

a first photodiode formed on the semiconductor substrate, the first photodiode having a plurality of regions which are connected in series with each other;

a second photodiode formed on the semiconductor substrate, the second photodiode having a plurality of regions which are connected in series with each other;

a first amplifier circuit configured to amplify photocurrent from the first photodiode, the first amplifier circuit being formed on the semiconductor substrate;

a second amplifier circuit configured to amplify photocurrent from the second photodiode, the second amplifier circuit being formed on the semiconductor substrate and having an amplifying characteristic substantially identical to that of the first photodiode;

an infrared transmissive filter configured to attenuate visible light components relative to infrared light components in incident light, the infrared transmissive filter being provided on the second photodiode; and a subtraction circuit configured to output a difference between an output of the first amplifier circuit and an output of the second amplifier circuit, the subtraction circuit being formed on the semiconductor substrate, on the semiconductor substrate, each of the plurality of regions of the first photodiode and its corresponding one of the plurality of regions of the second photodiode are placed substantially symmetric with respect to a line passing through a center of the semiconductor substrate.

DETAILED DESCRIPTION OF THE INVENTION

Embodiments of the invention will now be described with reference to the drawings.

Figure 1:
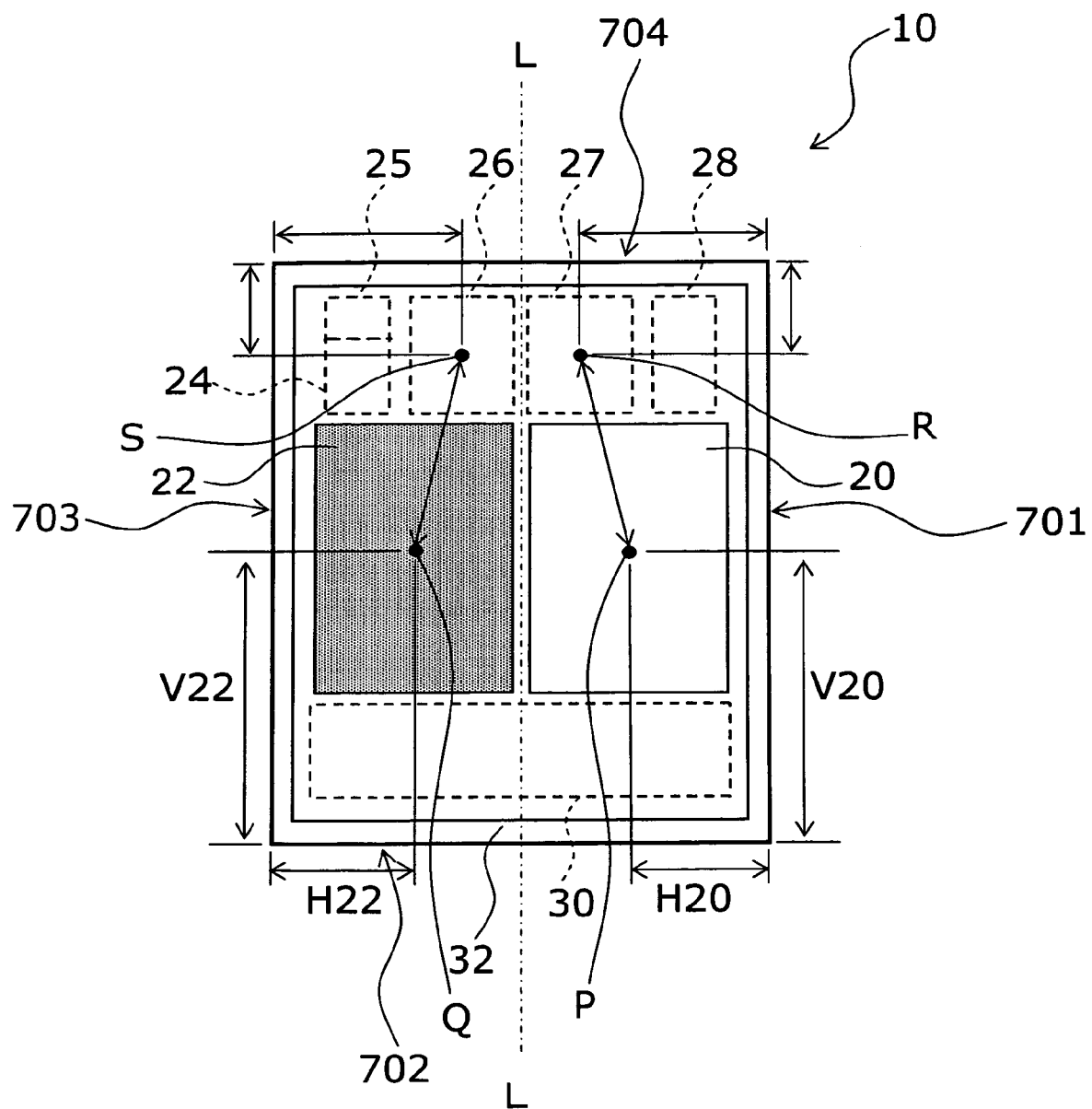
FIG. 1 is a schematic plan view showing a relevant part of a semiconductor photosensor according to a first embodiment of the invention.

FIG. 1 is a schematic plan view showing a relevant part of a semiconductor photosensor according to a first embodiment of the invention.

Figure 2:
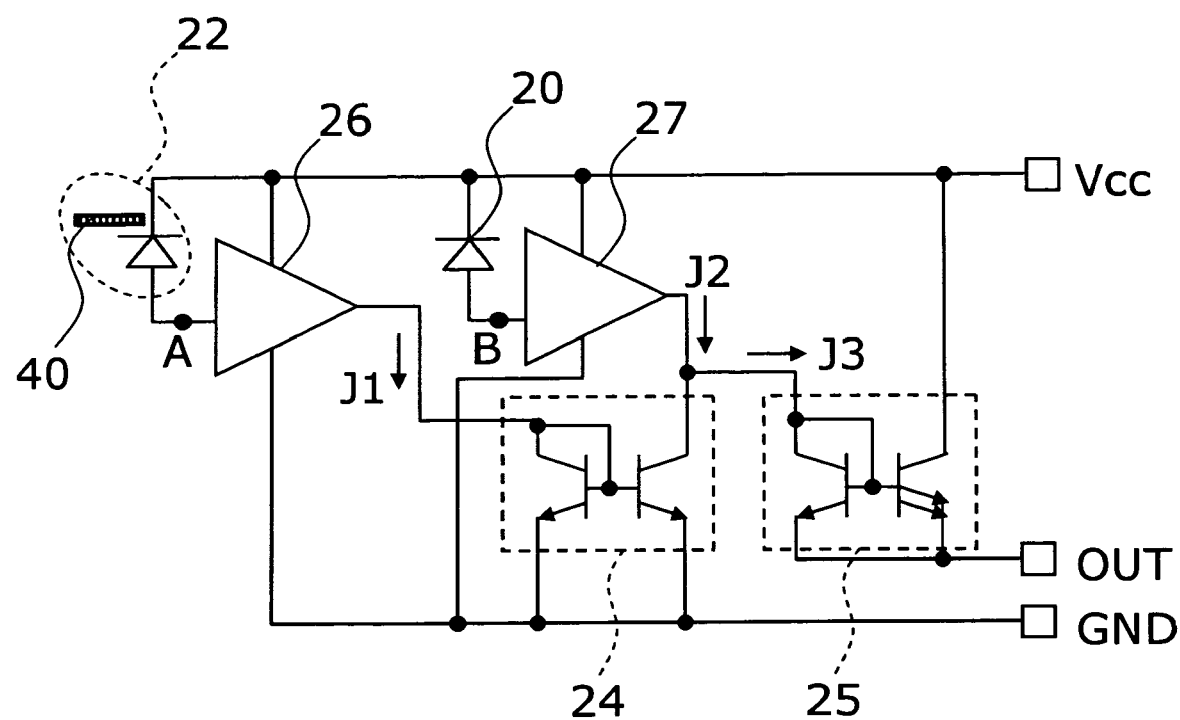
FIG. 2 is an equivalent circuit diagram of a semiconductor photosensor according to the first embodiment.

FIG. 2 is an equivalent circuit diagram thereof.

A photodiode 20, an infrared transmissive filter equipped photodiode 22, a first amplifier circuit 27 and a second amplifier circuit 26 are monolithically placed on a silicon substrate. The center P of the photodiode 20 and the center Q of the photodiode 22 are located on the silicon substrate symmetrically with respect to a line that passes through the center of the silicon substrate. The term "center of the photodiode" used herein refers to the two-dimensional centroid of the pn junction of the photodiode as viewed from above the major surface of the silicon substrate.

In this embodiment, it can also be said that identically shaped photodiodes 20 and 22 are placed on the silicon substrate symmetrically with respect to a line L-L' shown by chain line in FIG. 1 that passes through the center of the silicon substrate.

If the infrared transmissive filter is removed from the photodiode 22, it is desirable that the photodiodes 20 and 22 have nearly identical spectral sensitivity characteristics.

The photodiode 20 without the infrared transmissive filter is connected to an input terminal B of a first amplifier circuit 27. The infrared transmissive filter equipped photodiode 22 is connected to an input terminal A of a second amplifier circuit 26.

As described above, in this embodiment, the photodiode 20 and the infrared transmissive filter equipped photodiode 22 are placed at horizontally symmetrical locations on the silicon substrate. That is, the photodiodes 20 and 22 are generally placed substantially equidistant from the chip side face of the silicon substrate (i.e., the side faces of the diced silicon substrate).

For example, the horizontal distance H20 between the center P of the first photodiode 20 and the chip side face 701 is set to be equal to the horizontal distance H22 between the center Q of the second photodiode 22 and the chip side face 703. Similarly, the vertical distance V20 between the center P and the chip side face 702 is set to be equal to the vertical distance V22 between the center Q and the chip side face 702.

In this way, the optical environments of the photodiodes 20 and 22 can be made nearly identical to each other. It is desirable to place the photodiodes 20 and 22 close to each other in order to make their optical environments close to each other.

In this embodiment, the first amplifier circuit 27 and the second amplifier circuit 26 are integrated into a single chip. The first amplifier circuit 27 and the second amplifier circuit 26 are located close to each other, substantially equidistant from the chip side faces. In other words, the distance between the center R of the first amplifier circuit 27 and the side face 704, and the distance between the center S of the second amplifier circuit 26 and the side face 704 are substantially equal. Moreover, the first amplifier circuit 27 and the second amplifier circuit 26 are also substantially equidistant from the centers of the respective photodiodes 20 and 22. In other words, the distance between P and R, and the distance between Q and S are substantially equal. This is intended to reduce the effect of current due to photocarriers generated outside the photodiode region, as described later in detail.

Note that in FIG. 1, the first amplifier circuit 27 and the second amplifier circuit 26 may be placed interchangeably.

The outputs of the second amplifier circuit 26 and the first amplifier circuit 27 are connected to a third amplifier circuit 24 such as a current mirror circuit with unity gain, for example. At a subsequent stage, a fourth amplifier circuit 25 is additionally connected and an output signal is extracted from its OUT terminal. Moreover, a dummy circuit 28 and a pad section 30 are placed on the chip, and a scribe section 32 is provided on the chip periphery. The dummy circuit 28 is provided to make its optical environment equivalent to that of the third amplifier circuit 24 and the fourth amplifier circuit 25 with respect to generation and absorption of photocarriers. In general, a photodiode has a lower output current than a phototransistor. However, a photodiode has sensitivity with small temperature variation, and also has a small variation range of spectral sensitivity between elements. Hence a photo IC 10, where photodiodes and photocurrent amplifier circuits are integrated into a single chip, is suitable to a semiconductor photosensor.

Next, the operation in this embodiment is described hereinafter.

Figure 3:
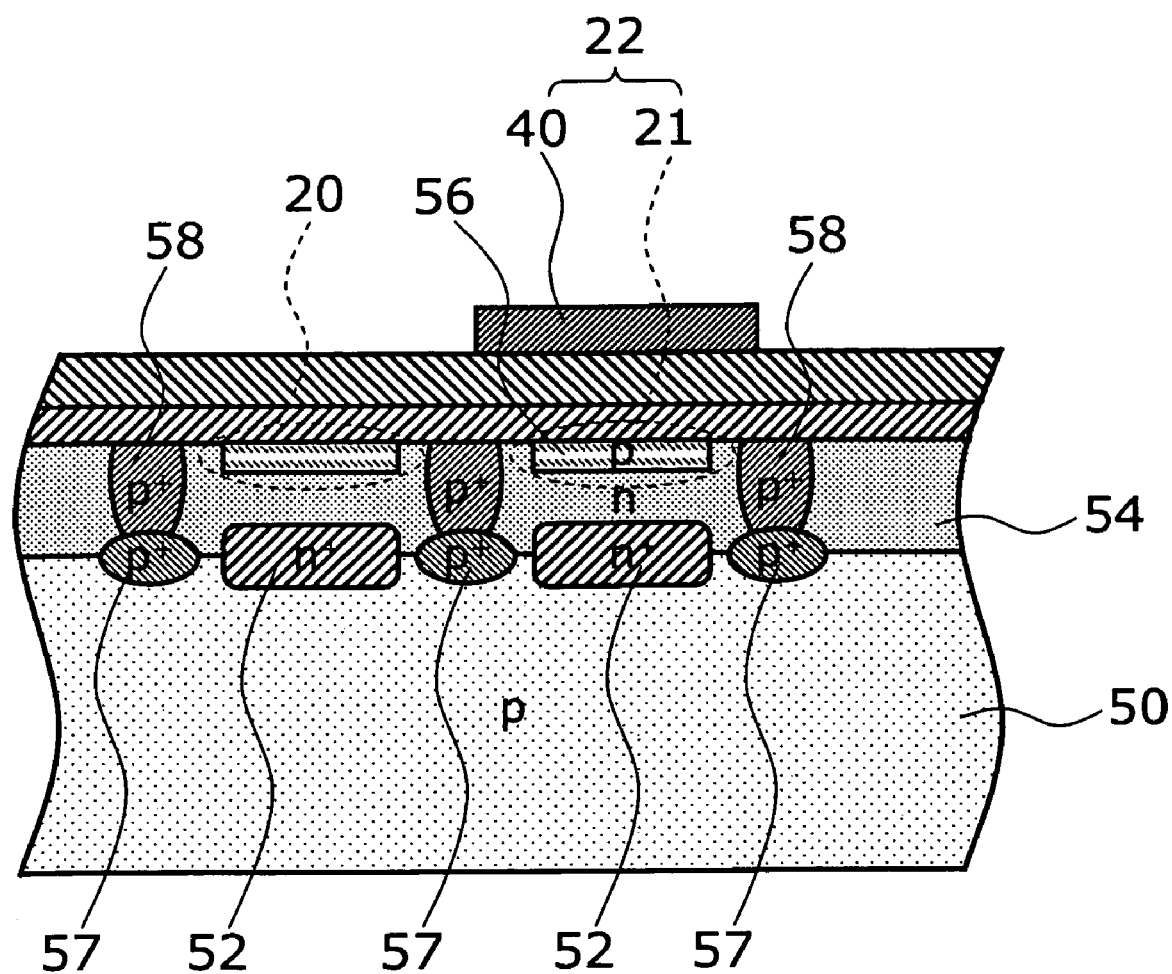
FIG. 3 is a schematic cross-sectional view showing a relevant part of a photodiode in the first embodiment.

FIG. 3 is a schematic cross-sectional view showing a relevant part of the photodiode.

Figure 4:
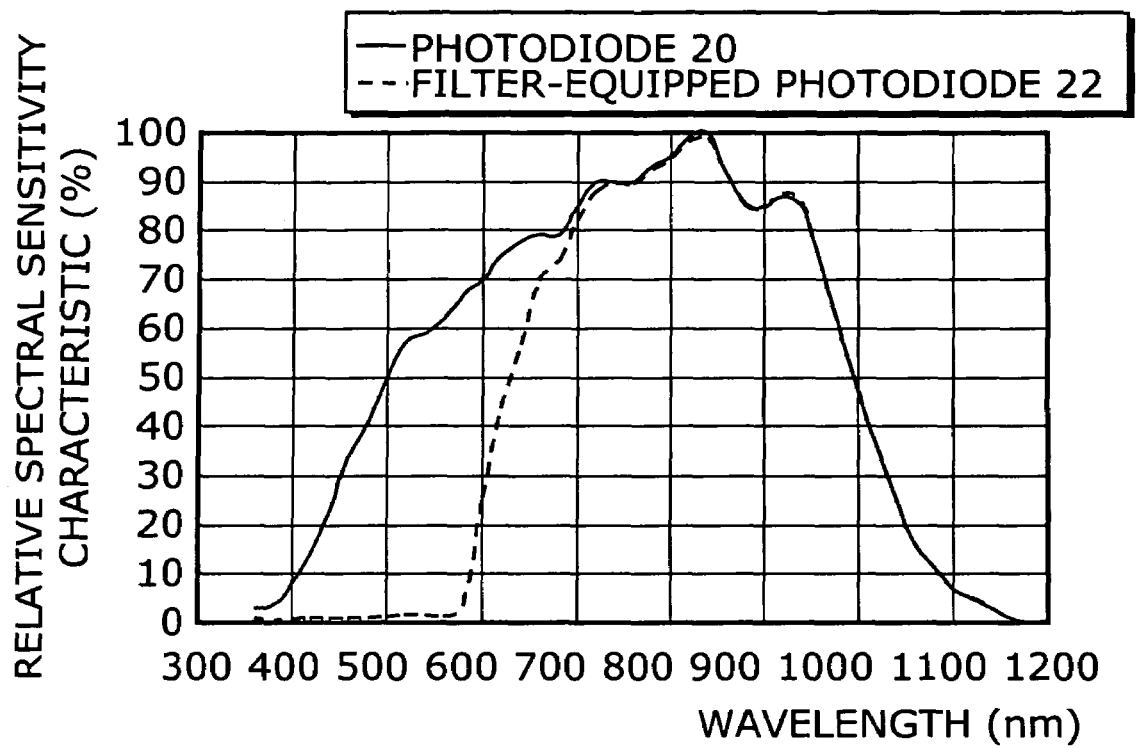
FIG. 4 is a graphical diagram showing the wavelength dependence of spectral sensitivity of the photodiode in the first embodiment.

FIG. 4 is a graphical diagram showing the spectral sensitivity characteristic of the individual photodiodes.

Figure 5:
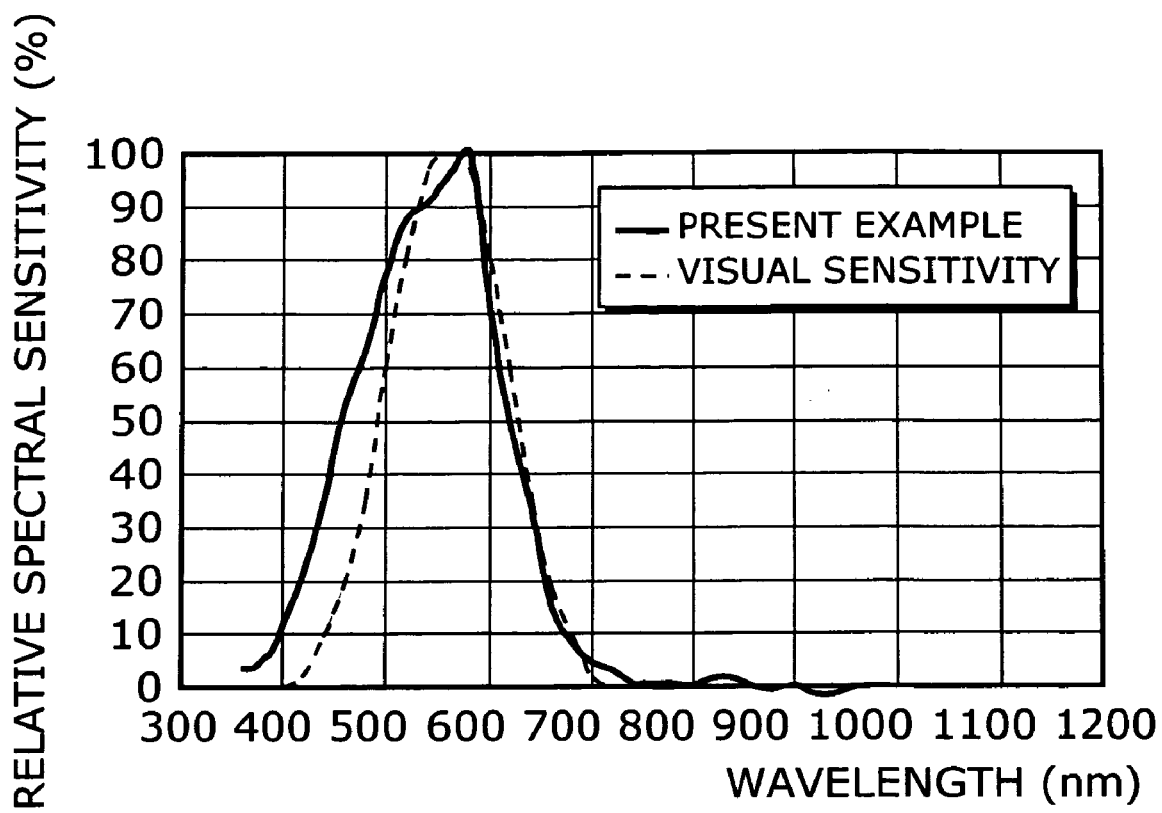
FIG. 5 is a graphical diagram comparing the spectral sensitivity with human eye spectral sensitivity in the first embodiment.

FIG. 5 is a graphical diagram comparing the spectral sensitivity characteristic obtained in this embodiment with human eye spectral sensitivity.

On a p-type silicon substrate 50, an n$^+$-type buried layer 52 and a p$^+$-type buried layer 57 are formed, and further an n-type epitaxial layer 54 is formed thereon. Moreover, a p-type layer 56 serving as an anode of the photodiode and a p$^+$-type layer 58 are formed. The broken ellipses represent the photodiodes 20 and 21. An infrared transmissive (visible light blocking) filter 40 is placed above the photodiode 21 to form an infrared transmissive filter photodiode 22.

The horizontal axis in FIG. 4 indicates wavelength (nm), and the vertical axis indicates relative spectral sensitivity (%). The infrared transmissive filter 40 used herein transmits wavelengths above about 580 nanometers and attenuates wavelengths therebelow. As a result, wavelengths below 580 nanometers are cut off in the relative spectral sensitivity of the infrared transmissive filter equipped photodiode 22. On the other hand, the spectral sensitivity of the filterless photodiode 20 approximately shows the wavelength dependence of the quantum efficiency of silicon, which has a sensitivity peak near 800 to 900 nanometers.

Returning to FIG. 2, current from the infrared transmissive filter equipped photodiode 22 is amplified to J1 by the second amplifier circuit 26. On the other hand, current from the photodiode 20 is amplified to J2 by the first amplifier circuit 27. It is important here that the first amplifier circuit 27 and the second amplifier circuit 26 are nearly identical in amplifier circuit characteristics including their gain. Subtraction is then performed by the third amplifier circuit 24, serving as a current mirror with unity gain, to produce current J3 nearly equal to (J2−J1), which is injected into the fourth amplifier circuit 25. This results in current 13 that exhibits a spectral sensitivity characteristic close to human eye spectral sensitivity. Note that the subtraction circuit 24 may be omitted if there exists a filter having a steep transmission characteristic that only transmits visible light. However, such a filter is not easy to implement.

FIG. 5 is a graphical diagram showing the spectral sensitivity characteristic of the semiconductor photosensor of this embodiment.

More specifically, this figure shows the spectral sensitivity characteristic of this embodiment in solid line, and human eye spectral sensitivity in broken line for comparison. According to this embodiment, the spectral sensitivity in the infrared region is cut off, which results in a spectral sensitivity characteristic in close agreement with human eye spectral sensitivity.

Next, the reason for a good human eye spectral sensitivity achieved in this embodiment is described.

Figure 6:
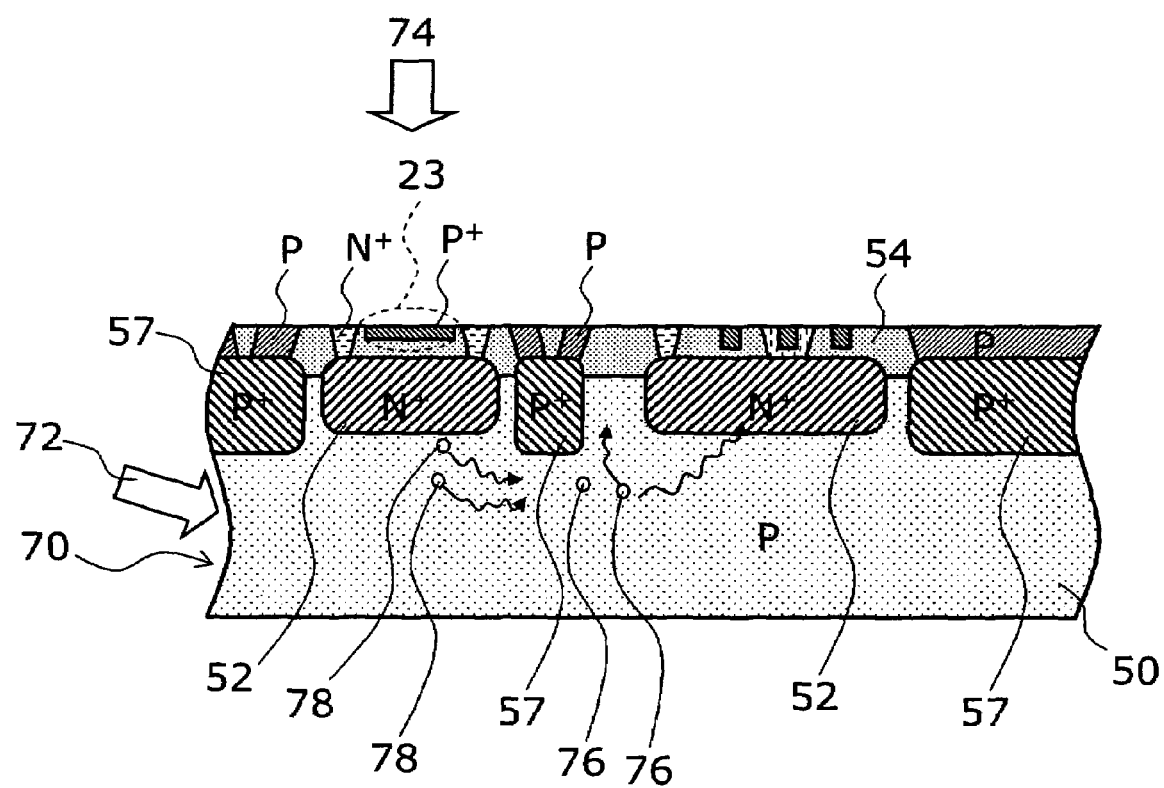
FIG. 6 is a schematic view showing photocurrent generated outside the photodiode region.

FIG. 6 is a schematic cross-sectional view illustrating a relevant part of the semiconductor photosensor.

On a p-type silicon substrate 50, a p$^+$-type buried layer 57 and an n$^+$-type buried layer 52 are formed, and an n-type layer 54 is epitaxially grown thereon. Moreover, a p$^+$-type layer serving as an anode of the photodiode is formed. When light 74 having a wavelength shorter than that corresponding to the band gap energy is incident on the front side of the photodiode 23 represented by the broken ellipse, the light is absorbed in the n-layer 54 and the photocurrent is generated. If the photocurrent is generated only in the region of the photodiode 23, a spectral sensitivity characteristic close to human eye spectral sensitivity can be readily achieved.

However, in an actual semiconductor device, light is also incident on regions of the chip surface outside the photodiode and on the chip side face 70. Moreover, light may reach deeper than the pn junction of the photodiode. For example, the current due to photocarriers 76 generated in the silicon substrate 50 by the light 72 incident on the chip side face 70 reaches the n$^+$-type layer 52. If the n$^+$-type layer 52 is the base of a lateral PNP transistor, the incoming current is added to the base current, thereby increasing the collector current by a factor of $h_{FE}$. If this lateral PNP transistor constitutes an amplifier circuit for photocurrent, it would exhibit a photocurrent value larger than the actual value. Furthermore, errors in the photocurrent may be increased because infrared light, which has wavelengths longer than visible light, reaches deeper in the silicon substrate 50. This effect is even more significant for incandescent lamps having more infrared components than fluorescent lamps.

Moreover, diffusion current due to photocarriers 78 generated by the light that has passed from the chip surface through the pn junction of the photodiode 21 and reached a deeper region also produces photocurrent larger than that produced by the photodiode alone. In semiconductor photosensors for measuring illuminance, the pn junction is often established at a small depth to adjust the peak light receiving sensitivity to human eye spectral sensitivity. For this reason, if incandescent lamps having more infrared components than fluorescent lamps are used, diffusion current of the photodiode increases, which results in more errors. It is undesirable that the output of the semiconductor photosensor depend on light sources in this manner.

Next, the gain of the amplifier circuits 26 and 27 is described.

It is preferable that a semiconductor photosensor for use as an illuminance sensor operate for illuminances of several lux outdoors at night up to tens of thousands of lux outdoors in fine weather. A photodiode that receives light in this range has an output current range of several nanoamperes to several microamperes, and is required to have a linear variation of output current in this illuminance range. In this case, for photocurrents toward the lower limit of several nanoamperes, illuminance measured without the influence of noise.

To reduce the effect of photocurrent generated in the p-type silicon substrate 50 described above, it is desirable to amplify the small current generated in the photodiode 21. Preferably, the amplifier circuits 26 and 27 have power gain in the range of ten to several hundreds.

Figure 7:
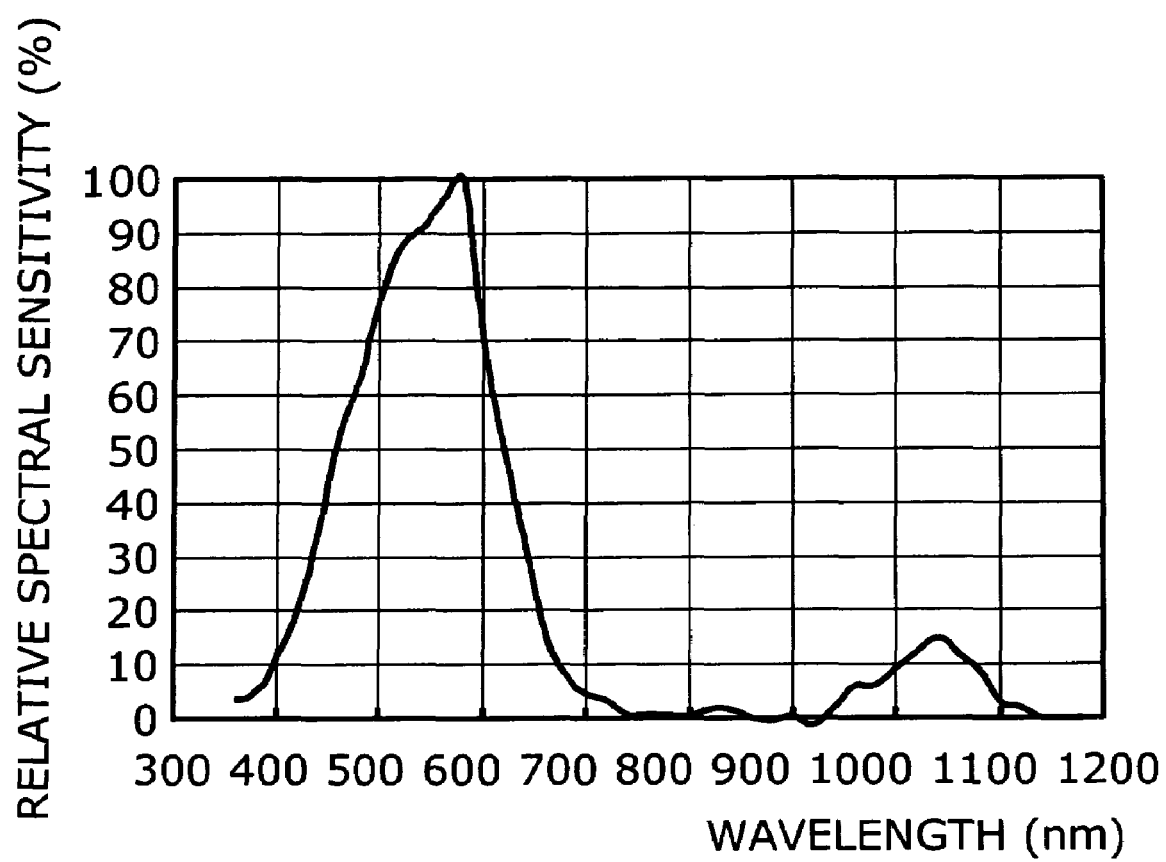
FIG. 7 is a graphical diagram showing disturbance in spectral sensitivity caused by the photocurrent generated outside the photodiode region.

FIG. 7 is a graphical diagram showing an embodiment of relative spectral sensitivity characteristic in a comparative embodiment.

More specifically, this comparative embodiment is similar to the above embodiment in having the photodiode 21 illustrated in FIG. 6 and obtaining a spectral sensitivity characteristic by current subtraction between the photodiode 21 and a photodiode equipped with an infrared transmissive filter. However, the two photodiodes and the amplifier circuits connected thereto, respectively, are not placed in optically equivalent locations. That is, the distance from the chip side face differs between the two photodiodes. Similarly, each amplifier circuit has a different distance from the chip side face, and each amplifier circuit also has a different distance from the photodiode separating region. As a result, the output current of the two photodiodes and the output of the two amplifier circuits are differently affected by diffusion current. Consequently, the current obtained by subtraction includes influence of diffusion current. For this reason, as illustrated in FIG. 7, a subpeak of spectral sensitivity appears near a wavelength of 1,050 nanometers. This subpeak causes deviation from the spectral characteristic of human eye spectral sensitivity, which obstructs precise brightness control of a mobile phone screen.

According to the inventor's investigation, this subpeak can be reduced by decreasing the chip thickness and/or decreasing light incidence on the chip side face. Conversely, this reveals that diffusion current caused by light incidence on the side face deteriorates the spectral sensitivity characteristic.

The quantum efficiency of silicon material has a sensitivity peak near 800 to 900 nanometers, depending on the thickness of the light absorbing layer. The sensitivity decreases to about 80% of its maximum near 580 nanometers where human eye spectral sensitivity reaches a peak. That is, even at the same optical power, infrared light produces more current output, which results in increased errors.

In contrast, according to the present embodiment, the distance between the photodiode and the chip side face is equal for the photodiode 20 and for the infrared transmissive filter equipped photodiode 22. Moreover, the two amplifier circuits are placed equidistant from the chip side face, and are also placed equidistant from the two photodiodes, respectively. Therefore, unwanted photocurrent due to incident light on the side face 70 is substantially canceled by subtraction, which achieves significant reduction of its effect.

Furthermore, the effect of photocurrent generated by incident light that has reached deeper than the photodiode junction can be minimized by directly connecting the first amplifier circuit 27 and the second amplifier circuit 26 to the photodiodes. In addition, since the current to be detected by the photodiodes is amplified by the first amplifier circuit 27 and the second amplifier circuit 26, the influence of light from the side face is relatively reduced.

According to this embodiment, for the reason described above, a spectral sensitivity characteristic that is extremely close to human eye spectral sensitivity is achieved and no subpeak occurs in longer wavelengths, as illustrated in FIG. 5. This enables precise brightness control, and thereby an optimum screen adapted to the usage environment can be achieved.

Figure 8:
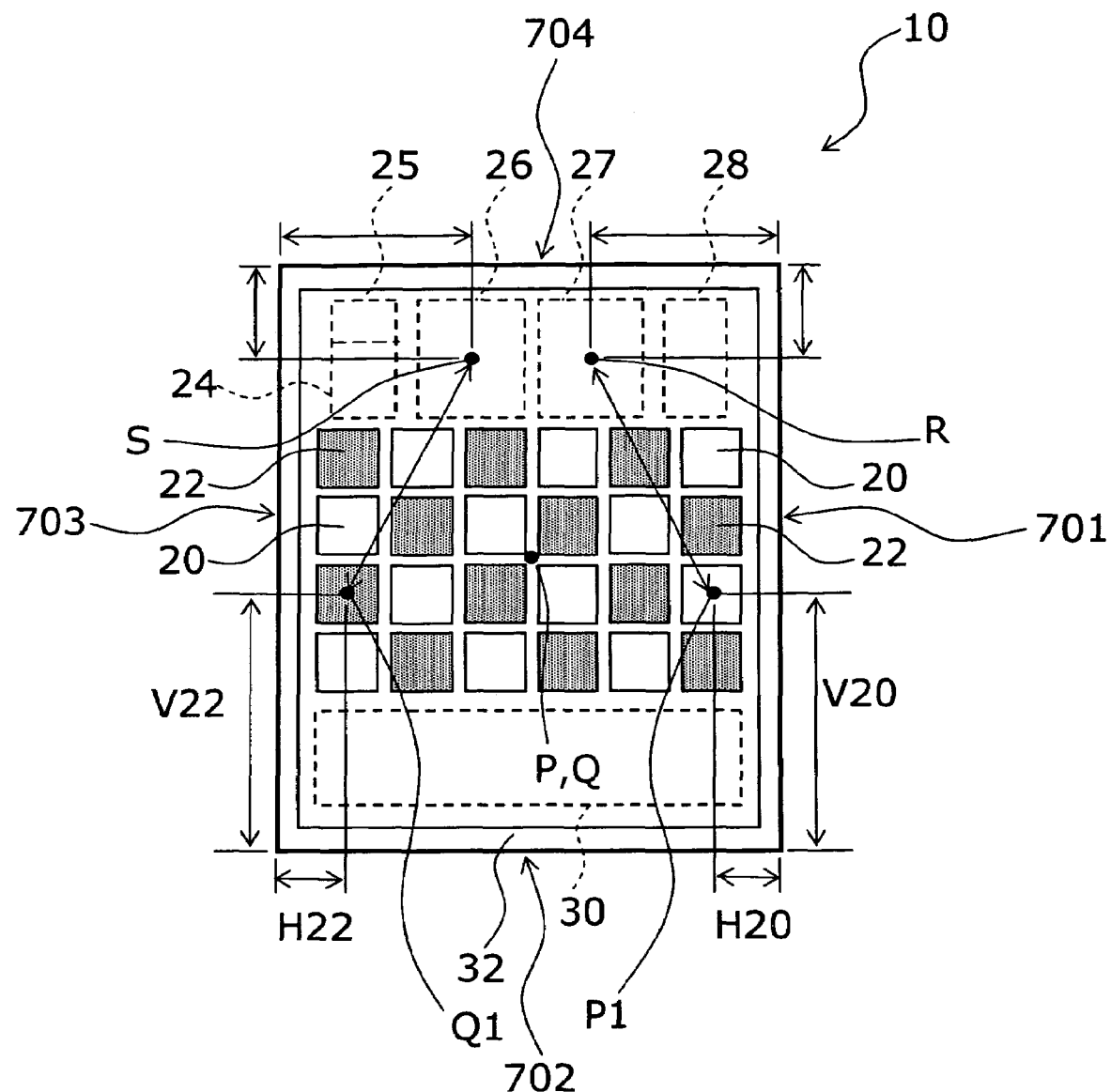
FIGS. 8 and 9 are schematic plan views showing a relevant part of a semiconductor photosensor according to a second embodiment of the invention.

FIG. 8 is a schematic plan view showing a relevant part of a semiconductor photosensor according to a second embodiment of the invention. In the figures following FIG. 8, the elements similar to those described with reference to the figures shown earlier are labeled with like reference numerals and will not be described in detail.

In this embodiment, photodiodes 20 and infrared transmissive filter equipped photodiodes 22 are alternately placed on a silicon substrate in a checker board pattern. The photodiode requires a certain minimum area because the detected current and the detecting precision are decreased if the area of the photodiode is smaller. In this situation, each of the diodes 20 and 22 can be divided into a plurality of regions and placed alternately, which facilitates placing the diodes 20, 22 in an optically equivalent configuration.

Among the divided photodiodes, the photodiodes 20 without the infrared transmissive filter are connected in parallel to each other and are connected to an input terminal B of a first amplifier circuit 27. The infrared transmissive filter equipped photodiodes 22 are also connected in parallel to each other and are connected to an input terminal A of a second amplifier circuit 26.

In this embodiment, the divided pairs of photodiodes 20 and infrared transmissive filter equipped photodiodes 22 are generally placed substantially equidistant from the chip side faces of the silicon substrate (i.e., the side faces of the diced silicon substrate).

For example, in FIG. 8, for each region of the divided photodiode 20, a region of the divided photodiode 22 is placed at a horizontally symmetrical location. The overall center P of the photodiodes 20 is identical to the overall center Q of the photodiodes 22 as shown in FIG. 8. That is, the photodiodes 20 and 22 can be arranged to have an equivalent optical environment.

Figure 9:
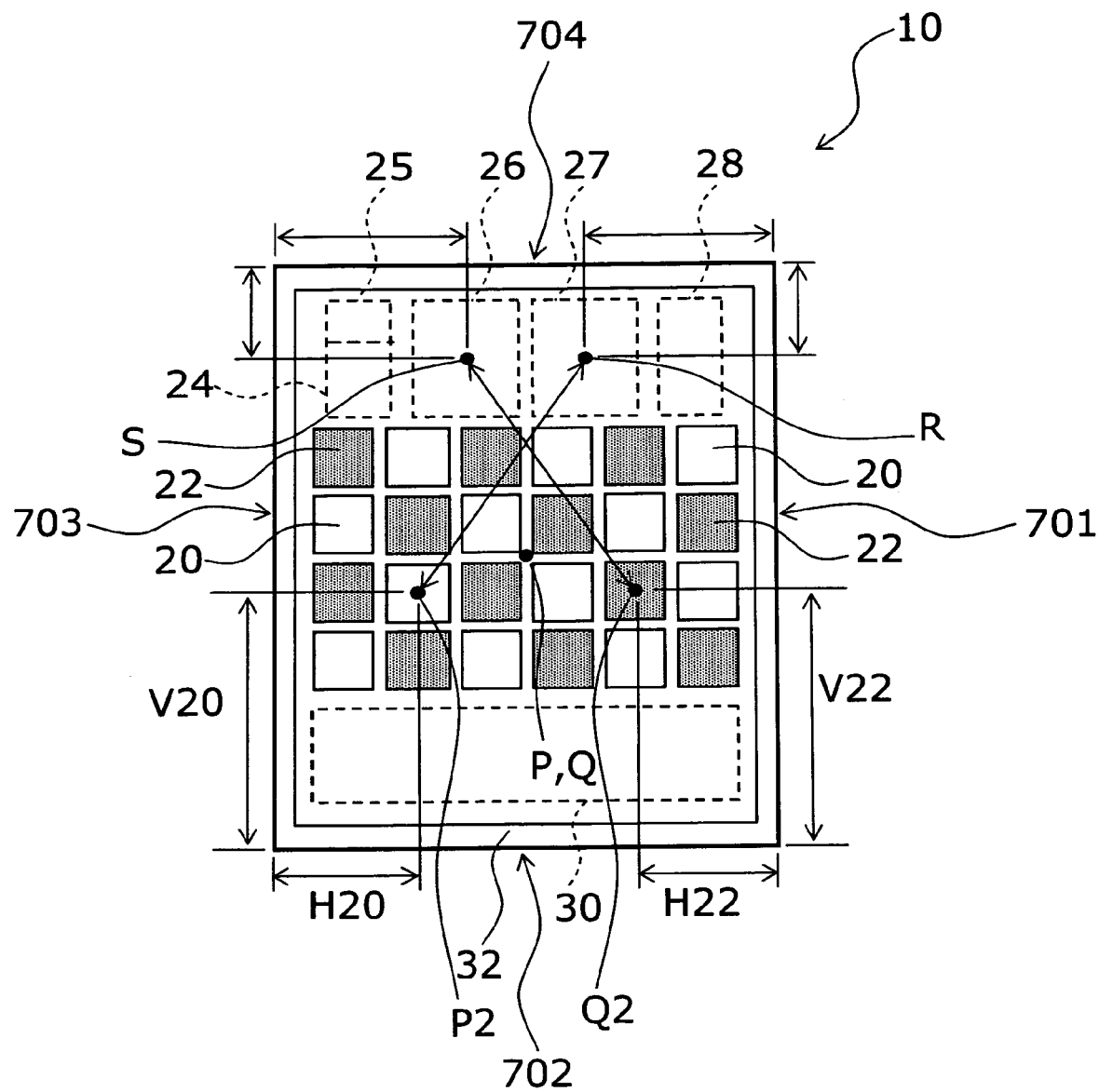

The horizontal distance H20 between the center P1 of a divided region of the first photodiode 20 and the chip side face 701 is set to be equal to the horizontal distance H22 between the center Q1 of the corresponding divided region of the second photodiode and the chip side face 703. Similarly, the vertical distance V20 between the center P1 and the chip side face 702 is set to be equal to the vertical distance V22 between the center Q1 and the chip side face 702. FIG. 9 shows how a second photodiode 22 having center Q2 adjacent to the first photodiode 20 having the center P1 is placed relative to the second amplifier circuit 26. FIG. 9 similarly shows how a first photodiode 20 having center P2 adjacent to the second photodiode 22 having the center Q1 is placed relative to the first amplifier circuit 27.

The photodiodes 20 and 22 can be divided into a plurality of regions corresponding to each other like points P1 and Q1, or points P2 and Q2. The regions are preferably placed at symmetrical locations close to each other in order to be equally affected from the environment. Note that the alternate arrangement like FIGS. 8 and 9 is not necessarily required because the placement of the divided regions corresponding to each other retains symmetry. That is, some of the divided regions belonging to one type of photodiodes may be consecutively placed. However, alternate arrangement will further equalize the effect of the environment.

In this way, each of the photodiodes 20 and 22 can be divided and placed at symmetrical locations to facilitate large light receiving area and optically equivalent placement at the same time. As a result, a spectral sensitivity characteristic close to human eye spectral sensitivity can be further ensured at high sensitivity.

Next, modifications of a semiconductor photosensor according to the second embodiment are described.

FIGS. 10 to 14 are schematic plan views showing the modified embodiment.

Figure 10:
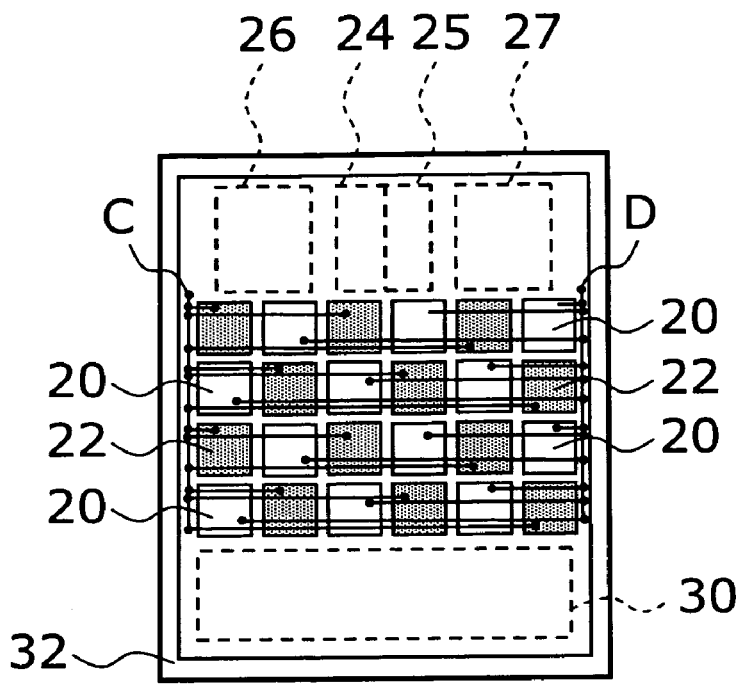
FIG. 10 is a schematic plan view showing a first modification of the relevant part of a semiconductor photosensor according to the second embodiment of the invention.

More specifically, FIG. 10 shows a first modification. The first amplifier circuit 27 and the second amplifier circuit 26 are placed substantially with line symmetry at the corners of the chip. As a result, the distance from the amplifier circuit to the first photodiodes 20 can be made substantially equal to the counterpart of the second photodiodes 22. The first photodiodes 20 and the second photodiodes 22 are placed substantially in the same way as in the second embodiment. Note that an embodiment connection among multiply divided photodiodes is shown. In practice, the wiring is provided so as to reduce the effect on the light incidence surface. Note that although not shown, similar wiring is also provided in FIGS. 1, 11 to 14. Current from the first photodiodes 20 is collected at a terminal D, and then inputted to the second amplifier circuit 26. Similarly, current from the second photodiodes 22 is collected at a terminal C, and then inputted to the first amplifier circuit 27.

Figure 11:
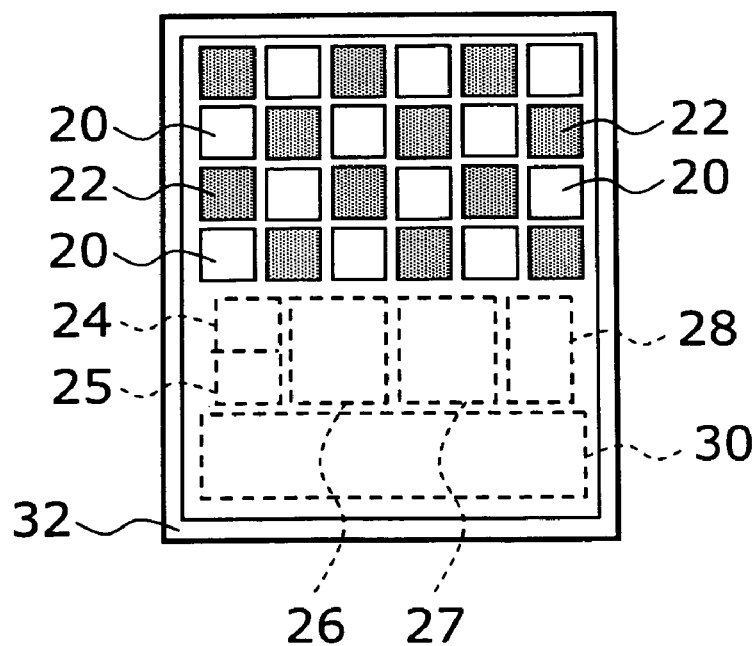
FIG. 11 is a schematic plan view showing a second modification of the relevant part of a semiconductor photosensor according to the second embodiment of the invention.

FIG. 11 shows a second modification.

The photodiodes are placed close to three side faces. The first amplifier circuit 27 and the second amplifier circuit 26 are placed at horizontally symmetrical locations, and have substantially equal distances to the first photodiodes 20 and the second photodiodes 22. A third amplifier circuit 24, a fourth amplifier circuit 25, and a pad section 30 are placed on the remaining space.

Figure 12:
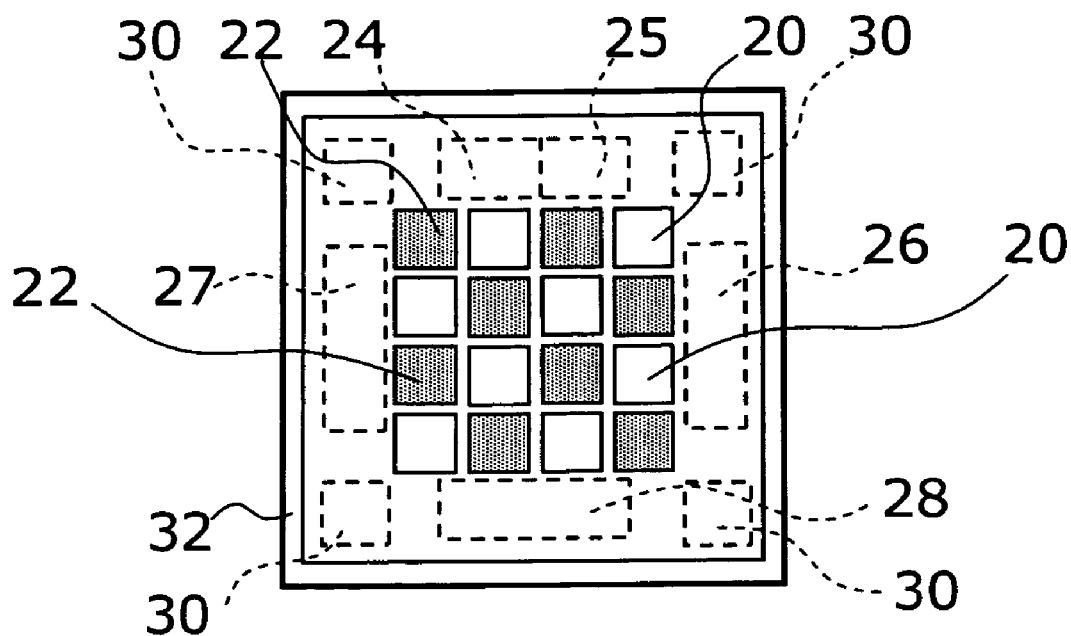
FIG. 12 is a schematic plan view showing a third modification of the relevant part of a semiconductor photosensor according to the second embodiment of the invention.

FIG. 12 shows a third modification.

The first photodiodes 20 and the second photodiodes 22 are placed at the center of the chip. The first amplifier circuit 27 and the second amplifier circuit 26 are placed at horizontally symmetrical locations, and have substantially equal distances to the photodiodes.

Figure 13:
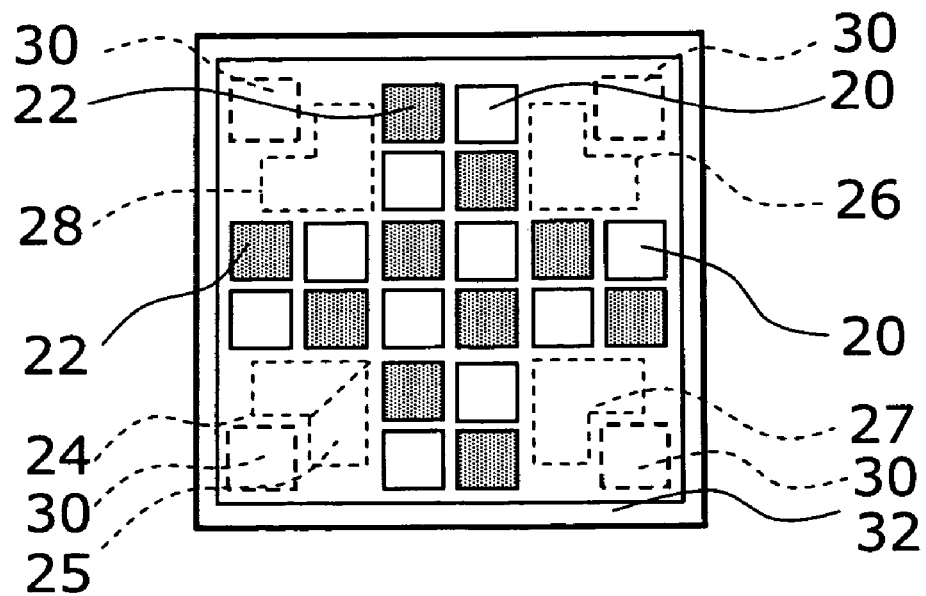
FIG. 13 is a schematic plan view showing a fourth modification of the relevant part of a semiconductor photosensor according to the second embodiment of the invention.

FIG. 13 shows a fourth modification.

The first photodiodes 20 and the second photodiodes 22 are placed in a crisscross pattern. The first amplifier circuit 27 and the second amplifier circuit 26 are placed at vertically symmetrical locations. As a result, the distance between the first photodiodes 20 and the first amplifier circuit 27 can be made equal to the distance between the second photodiodes 20 and the second amplifier circuit 26, respectively.

Figure 14:
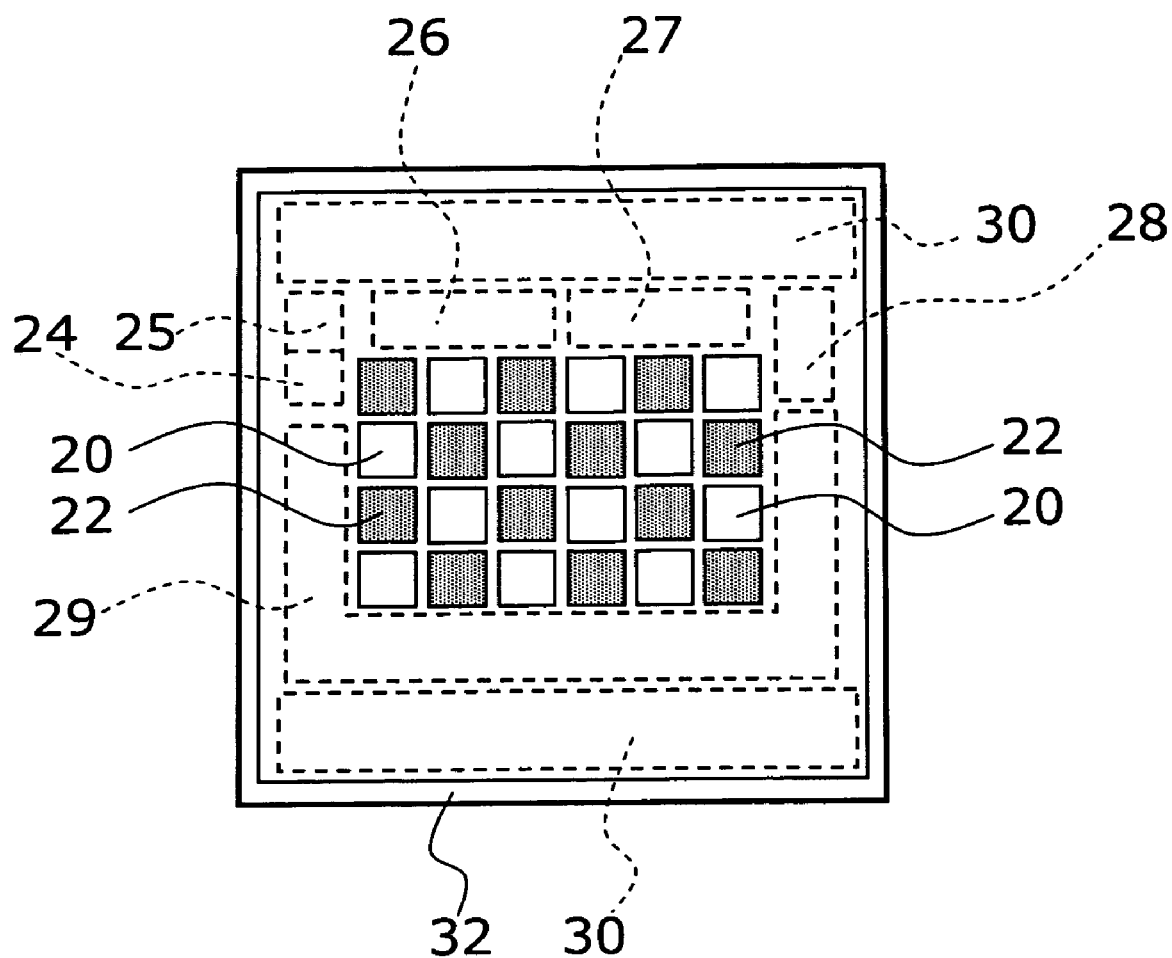
FIG. 14 is a schematic plan view showing a fifth modification of the relevant part of a semiconductor photosensor according to the second embodiment of the invention.

FIG. 14 shows a fifth modification.

The first photodiodes 20 and the second photodiodes 22 are placed at the center of the chip. The first amplifier circuit 27 and the second amplifier circuit 26 are placed close to the photodiodes at horizontally symmetrical locations, and thus the distances to the photodiodes can be made equal to each other. In addition to the third amplifier circuit 24, fourth amplifier circuit 25, dummy circuit 28, and pad section 30, a peripheral circuit 29 is placed for more sophisticated functionality.

Next, a relevant part of a semiconductor photosensor according to a third embodiment of the invention is described.

Figure 15:
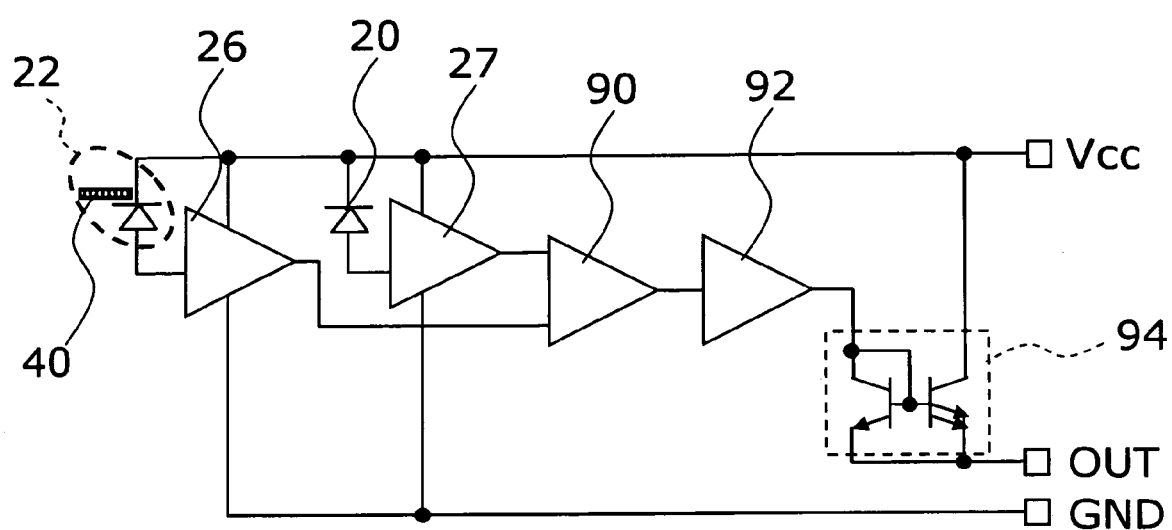
FIG. 15 is an equivalent circuit diagram of a relevant part of a semiconductor photosensor according to a third embodiment of the invention.

FIG. 15 is an equivalent circuit diagram of this embodiment.

The detected current from the first photodiode 20 is inputted to the first amplifier circuit 27. The detected current from the second photodiode 22 equipped with the infrared transmissive filter 40 is inputted to the second amplifier circuit 26. The output current from the first amplifier circuit 27 and the output current from the second amplifier circuit 26 are subjected to subtraction and then amplified by a sixth amplifier circuit 90. The first amplifier circuit 27 and the second amplifier circuit 26 can be adjusted to amplify photocurrent equally to an appropriate value, and thereby the effect of photocarriers generated in the silicon substrate can be reduced in the sixth amplifier circuit 90 and a seventh amplifier circuit 92. The seventh amplifier circuit 92 allows for obtaining an output current larger than in the second embodiment.

Next, a relevant part of a semiconductor photosensor according to a fourth embodiment of the invention is described.

Figure 16:
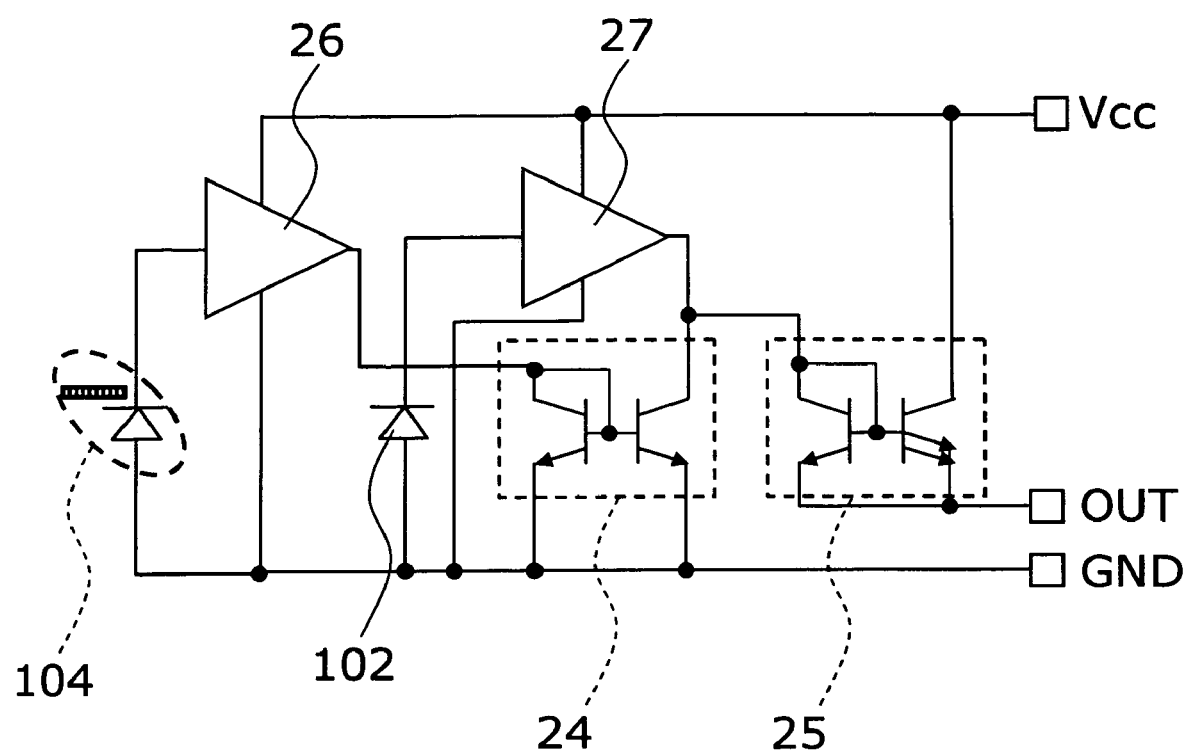
FIG. 16 is an equivalent circuit diagram of a relevant part of a semiconductor photosensor according to a fourth embodiment of the invention.

FIG. 16 is an equivalent circuit diagram of this embodiment.

Figure 17:
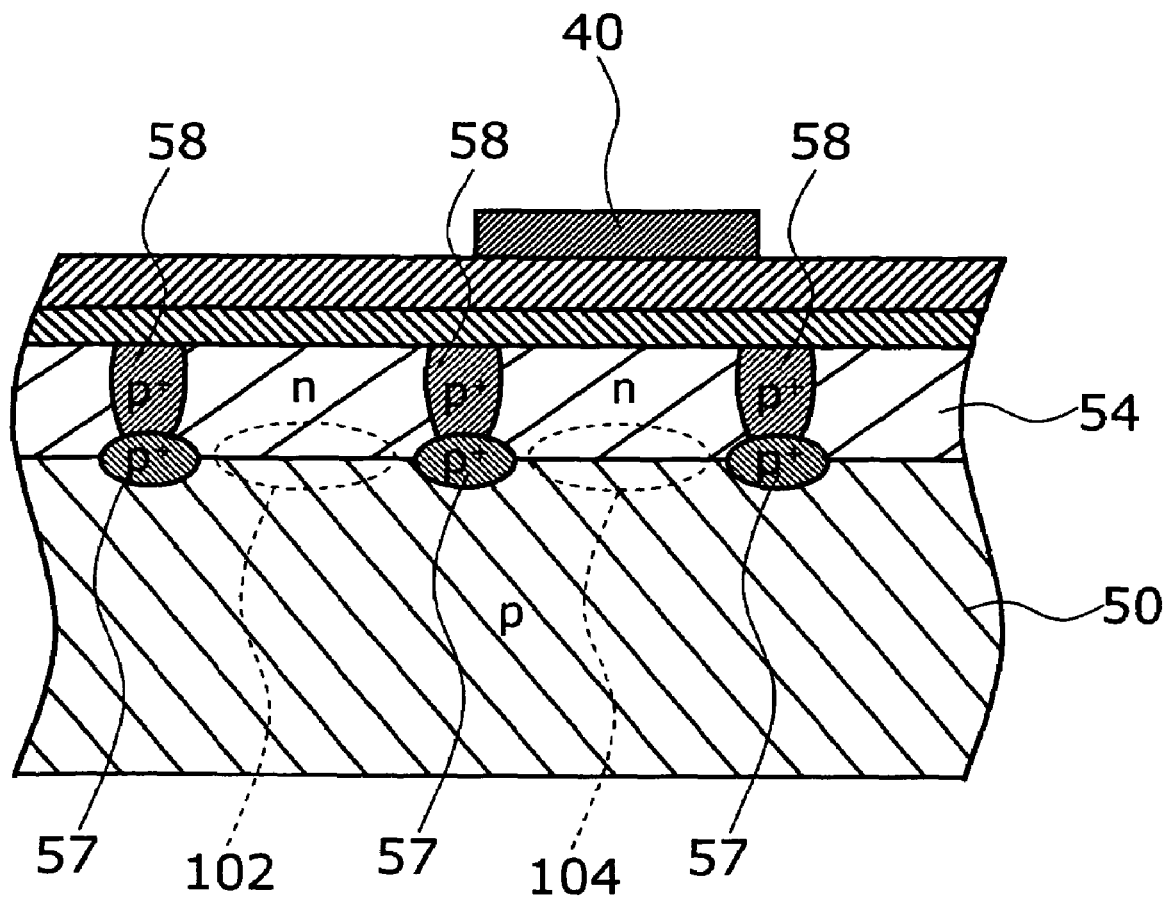
FIG. 17 is a schematic cross-sectional view showing a photodiode in the photo IC illustrated in FIG. 15.

FIG. 17 is a schematic cross-sectional view showing a relevant part of the photodiode.

On a p-type silicon substrate 50, a $p^+$-type buried layer 57 is formed, and an n-type epitaxial layer 54 is grown thereon. Moreover, a $p^+$-type layer 58 is formed for separating photodiodes 102 and 104. This example utilizes pn junctions between the p-type silicon substrate 50 and the n-layer 54. As a result, the p-type layer side of the photodiode is grounded. The operation of the circuit is similar to the second embodiment.

Next, a semiconductor photosensor is described.

Figure 18:
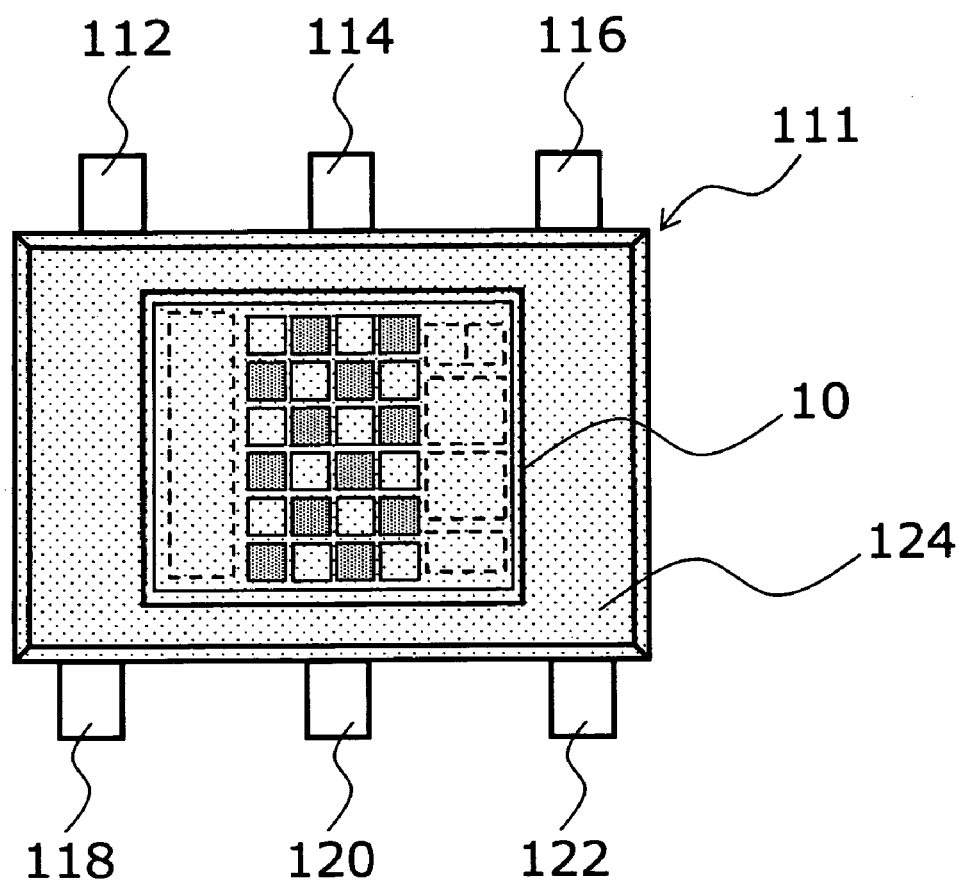
FIG. 18 is a schematic plan view showing a relevant part of a semiconductor photosensor according to the embodiments of the invention.

FIG. 18 is a schematic plan view showing a semiconductor photosensor according to the first to fourth embodiments of the invention.

Figure 19:
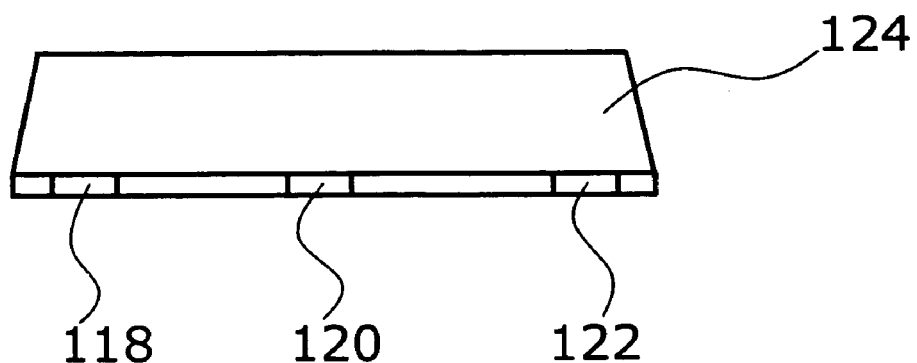
FIG. 19 is a schematic side view showing a relevant part of a semiconductor photosensor according to the embodiments of the invention.

FIG. 19 is a schematic side view thereof.

The photo IC 10 described above is incorporated, for example, into a surface mount device (SMD) package illustrated in FIGS. 18 and 19. The photo IC 10 is mounted on the package and wire bonded to leads. For example, it is possible to use the lead 116 for supply voltage Vcc, the leads 112, 114, 118, and 120 for ground, and the lead 122 for an output terminal. The photo IC and bonding wire (not shown) are sealed with transparent resin 124 that transmits visible light, and thus a semiconductor photosensor 111 is completed. Its outer dimensions can be as small as, for example, 1.6 mm×1.6 mm×0.55 mm (thickness).

Figure 20:
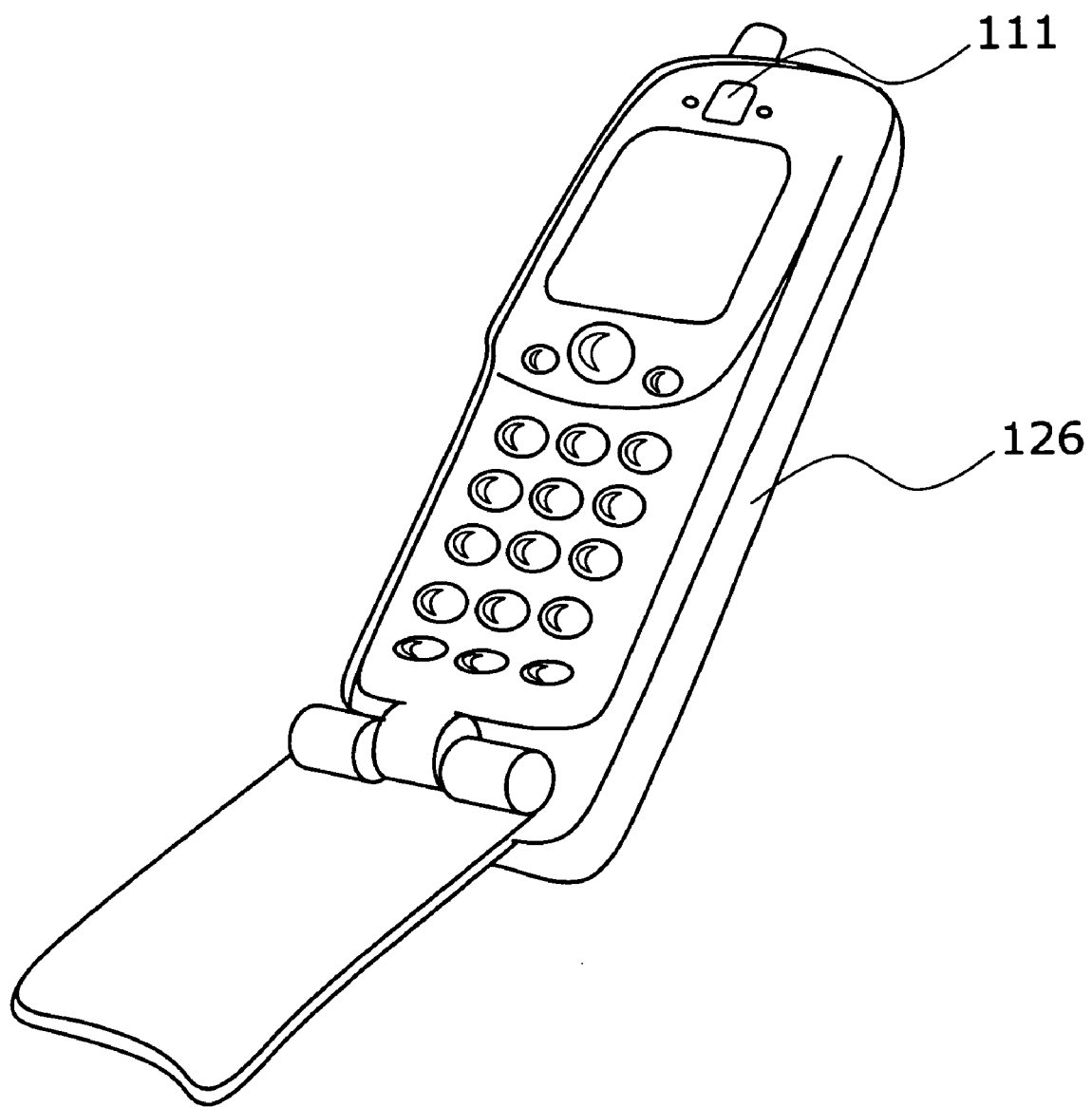
FIG. 20 is a schematic view showing a mobile phone equipped with the semiconductor photosensor according to the embodiments of the invention.

FIG. 20 is a schematic view showing a mobile phone 126 equipped with the semiconductor photosensor 111.

Since the semiconductor photosensor 111 is small as described above, it can be placed above the display screen and measure illuminance with a spectral sensitivity characteristic close to human eye spectral sensitivity. As a result, the semiconductor photosensor 111 can measure widely varying illuminances, whether at night or in the daytime and outdoors or indoors, for brightness control of the keypad and display backlight. For example, outdoors at night, keypad LEDs are turned on and the backlight of the liquid crystal display is reduced below half. Such usage can extend continuous uptime by several times as compared to the case without brightness control.

In addition, this eliminates the problem of unwanted response to infrared or other long-wavelength light. Therefore precise control adapted to human eye spectral sensitivity can be achieved.

The semiconductor photosensor of this embodiment is not limited to mobile phone applications, but can be widely applied to various information equipments such as notebook personal computers, PDAs, digital cameras, in-vehicle car navigation systems, and liquid crystal TV sets, in which sophisticated brightness control for image display and reduction of power consumption can be achieved.

Embodiments of the invention have been described with reference to examples. However, the invention is not limited to these examples. Any shape, material, and arrangement of the photodiodes, amplifier circuits, optical filters, transparent resin, package, and other elements constituting the semiconductor photosensor that are variously adapted by those skilled in the art, are also encompassed within the scope of the invention as long as they include the features of the invention.

The invention claimed is:

1. A semiconductor photosensor comprising:
a semiconductor substrate;
a first photodiode formed on the semiconductor substrate;
a second photodiode formed on the semiconductor substrate;
a first amplifier circuit configured to amplify photocurrent from the first photodiode, the first amplifier circuit being formed on the semiconductor substrate;
a second amplifier circuit configured to amplify photocurrent from the second photodiode, the second amplifier circuit being formed on the semiconductor substrate and having an amplifying characteristic substantially identical to that of the first photodiode;
an infrared transmissive filter configured to attenuate visible light components relative to infrared light components in incident light, the infrared transmissive filter being provided on the second photodiode; and
a subtraction circuit configured to output a difference between an output of the first amplifier circuit and an output of the second amplifier circuit, the subtraction circuit being formed on the semiconductor substrate,
a distance from a first side face of the semiconductor substrate to a center of the first photodiode being substantially equal to a distance from a second side face of the semiconductor substrate to a center of the second photodiode, the second side face being opposed to the first side face.

2. A semiconductor photosensor of claim 1, wherein the first photodiode and the second photodiode have a substantially identical area.

3. A semiconductor photosensor of claim 1, wherein the first photodiode and the second photodiode have a substantially identical spectral sensitivity characteristic.

4. A semiconductor photosensor of claim 1, wherein on the semiconductor substrate, the first amplifier circuit and the second amplifier circuit are placed substantially symmetric with respect to a line passing through the center of the semiconductor substrate.

5. A semiconductor photosensor of claim 1, wherein the first photodiode and the first amplifier circuit are placed substantially symmetric to the second photodiode and the second amplifier circuit with respect to a line passing through the center of the semiconductor substrate.

6. A semiconductor photosensor of claim 1, wherein the first photodiode, the second photodiode, the first amplifier circuit and the second amplifier circuit are monolithically formed on the semiconductor substrate.

7. A semiconductor photosensor comprising:
a semiconductor substrate;
a first photodiode formed on the semiconductor substrate;
a second photodiode formed on the semiconductor substrate;
a first amplifier circuit configured to amplify photocurrent from the first photodiode, the first amplifier circuit being formed on the semiconductor substrate;
a second amplifier circuit configured to amplify photocurrent from the second photodiode, the second amplifier circuit being formed on the semiconductor substrate and having an amplifying characteristic substantially identical to that of the first photodiode;
an infrared transmissive filter configured to attenuate visible light components relative to infrared light components in incident light, the infrared transmissive filter being provided on the second photodiode; and
a subtraction circuit configured to output a difference between an output of the first amplifier circuit and an output of the second amplifier circuit, the subtraction circuit being formed on the semiconductor substrate,
on the semiconductor substrate, the first photodiode and the second photodiode being placed substantially symmetric with respect to a line passing through a center of the semiconductor substrate.

8. A semiconductor photosensor of claim 7, wherein the first photodiode and the second photodiode have a substantially identical area.

9. A semiconductor photosensor of claim 7, wherein the first photodiode and the second photodiode have a substantially identical spectral sensitivity characteristic.

10. A semiconductor photosensor of claim 7, wherein the first photodiode and the second photodiode are divided into a plurality of regions, respectively.

11. A semiconductor photosensor of claim 7, wherein on the semiconductor substrate, the first amplifier circuit and the second amplifier circuit are placed substantially symmetric with respect to a line passing through the center of the semiconductor substrate.

12. A semiconductor photosensor of claim 7, wherein a distance from a first side face of the semiconductor substrate to the center of the first photodiode is substantially equal to the distance from a second side face of the semiconductor substrate to the center of the second photodiode, the second side face being opposed to the first side face.

13. A semiconductor photosensor of claim 7, wherein the first photodiode and the first amplifier circuit are placed substantially symmetric to the second photodiode and the second amplifier circuit with respect to a line passing through the center of the semiconductor substrate.

14. A semiconductor photosensor of claim 7, wherein the first photodiode, the second photodiode, the first amplifier circuit and the second amplifier circuit are monolithically formed on the semiconductor substrate.

15. A semiconductor photosensor comprising:
a semiconductor substrate;
a first photodiode formed on the semiconductor substrate, the first photodiode having a plurality of regions which are connected in parallel with each other;
a second photodiode formed on the semiconductor substrate, the second photodiode having a plurality of regions which are connected in parallel with each other;
a first amplifier circuit configured to amplify photocurrent from the first photodiode, the first amplifier circuit being formed on the semiconductor substrate;
a second amplifier circuit configured to amplify photocurrent from the second photodiode, the second amplifier circuit being formed on the semiconductor substrate and having an amplifying characteristic substantially identical to that of the first photodiode;
an infrared transmissive filter configured to attenuate visible light components relative to infrared light components in incident light, the infrared transmissive filter being provided on the second photodiode; and a subtraction circuit configured to output a difference between an output of the first amplifier circuit and an output of the second amplifier circuit, the subtraction circuit being formed on the semiconductor substrate, on the semiconductor substrate, each of the plurality of regions of the first photodiode and its corresponding one of the plurality of regions of the second photodiode are placed substantially symmetric with respect to a line passing through a center of the semiconductor substrate.

16. A semiconductor photosensor of claim 15, wherein an overall center of the first photodiode is substantially identical to an overall center of the second photodiode.

17. A semiconductor photosensor of claim 15, wherein the first photodiode and the second photodiode have a substantially identical area.

18. A semiconductor photosensor of claim 15, wherein the first photodiode and the second photodiode have a substantially identical spectral sensitivity characteristic.

19. A semiconductor photosensor of claim 15, wherein on the semiconductor substrate, the first amplifier circuit and the second amplifier circuit are placed generally symmetric with respect to the line passing through the center of the semiconductor substrate.

20. A semiconductor photosensor of claim 15, wherein the first photodiode, the second photodiode, the first amplifier circuit and the second amplifier circuit are monolithically formed on the semiconductor substrate.

* * * * *